US011270770B2

(12) United States Patent
Gan et al.

(10) Patent No.: US 11,270,770 B2
(45) Date of Patent: Mar. 8, 2022

(54) LOCAL WORD LINE DRIVER DEVICE, MEMORY DEVICE, AND FABRICATION METHOD THEREOF

(71) Applicant: Yangtze Memory Technologies Co., Ltd., Wuhan (CN)

(72) Inventors: Cheng Gan, Wuhan (CN); Wei Liu, Wuhan (CN); Shi Qi Huang, Wuhan (CN); Shunfu Chen, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 143 days.

(21) Appl. No.: 16/888,973

(22) Filed: Jun. 1, 2020

(65) Prior Publication Data

US 2021/0166762 A1 Jun. 3, 2021

Related U.S. Application Data

(63) Continuation of application No. PCT/CN2019/121565, filed on Nov. 28, 2019.

(51) Int. Cl.
| | | |
|---|---|---|
| *G11C 16/08* | (2006.01) | |
| *G11C 8/08* | (2006.01) | |
| *H01L 27/11556* | (2017.01) | |
| *H01L 27/11582* | (2017.01) | |
| *H01L 29/06* | (2006.01) | |

(52) U.S. Cl.
CPC .............. *G11C 16/08* (2013.01); *G11C 8/08* (2013.01); *H01L 27/11556* (2013.01); *H01L 27/11582* (2013.01); *H01L 29/0649* (2013.01)

(58) Field of Classification Search
CPC ...... G11C 16/08; G11C 8/08; H01L 27/11556; H01L 27/11582; H01L 29/0649; H01L 27/11529; H01L 27/11573; H01L 27/11531; H01L 27/11551; H01L 27/11578
See application file for complete search history.

(56) References Cited

U.S. PATENT DOCUMENTS

| | | | |
|---|---|---|---|
| 11,049,870 B2 * | 6/2021 | Sugisaki | .......... H01L 27/11565 |
| 2013/0100758 A1 | 4/2013 | Chen et al. | |

FOREIGN PATENT DOCUMENTS

| | | |
|---|---|---|
| CN | 1462478 A | 12/2003 |
| CN | 105825881 A | 8/2016 |
| CN | 107579087 A | 1/2018 |

* cited by examiner

*Primary Examiner* — Allison Bernstein
(74) *Attorney, Agent, or Firm* — Anova Law Group, PLLC

(57) ABSTRACT

Local word line driver device, memory device, and fabrication method are provided. A local word line driver device includes a substrate and an array of transistor structures formed on the substrate. The transistor structures are configured in rows and columns. The substrate includes a plurality of first field regions each between adjacent rows of the transistor structures, and a plurality of second field regions each between adjacent columns of the transistor structures. A deep trench isolation structure is formed in at least one field region of: the plurality of first field regions or the plurality of second field regions, of the substrate.

20 Claims, 7 Drawing Sheets

LOCAL WORD LINE DRIVER DEVICE, MEMORY DEVICE, AND FABRICATION METHOD THEREOF

CROSS-REFERENCE TO RELATED APPLICATION

This application is a continuation of International Application No. PCT/CN2019/121565, filed Nov. 28, 2019, the entire content of which is incorporated herein by reference.

FIELD OF THE DISCLOSURE

The present disclosure generally relates to the field of memory device and, more particularly, relates to a local word line driver device and fabrication method thereof.

BACKGROUND

In high density memory, the arrays of memory cells are divided into blocks of memory cells. Each block may include local word lines, requiring corresponding local word line drivers. A global word line driver drives a set of global word lines for a column of blocks in the array. Each word line in the set of global word lines is set according to the operation being applied to the selected blocks, such as read, program, and erase for high density devices. Some can require high voltages. Word line drivers can include pass transistors which are used to transfer voltages from global word lines to local word lines.

In a three-dimensional NAND memory, the chip size limitation may cause spacings between HVN (i.e., high voltage NMOS) devices in the XDEC pass transistor circuit to become smaller and smaller in both X- and Y-directions. During the cell program operation, the pass transistors need to transmit a high voltage of 25V of the source/drain region, at a gate voltage of 29V. A voltage difference between adjacent HVN devices may be about 25V. Conventionally, a p-type field implant is formed between HVN devices in X-direction to suppress punch through and p+ tap is formed between HVN devices in Y-direction to suppress latch up.

Problems arises, however, because the field implant requires an implant of same type ions as in the substrate, which may worsen the drain-source breakdown voltage (BVDss) of the HVN device. In addition, to ensure the function of the p+ tap, the spacings between HVN devices in Y-directions cannot continue to shrink and thus affect y-pitch shrinkage of the memory device.

The disclosed devices and fabrication methods are directed to solve one or more problems set forth above and other problems in the art.

BRIEF SUMMARY OF THE DISCLOSURE

One aspect of the present disclosure provides a local word line driver device, including a substrate and an array of transistor structures formed on the substrate. The transistor structures are configured in rows and columns. The substrate includes a plurality of first field regions each between adjacent rows of the transistor structures, and a plurality of second field regions each between adjacent columns of the transistor structures. A deep trench isolation structure is formed in at least one field region of: the plurality of first field regions or the plurality of second field regions, of the substrate.

Another aspect of the present disclosure provides a memory device. The memory device includes a local word line driver device. The local word line driver device includes a substrate and an array of transistor structures formed on the substrate. The transistor structures are configured in rows and columns. The substrate includes a plurality of first field regions each between adjacent rows of the transistor structures, and a plurality of second field regions each between adjacent columns of the transistor structures. A deep trench isolation structure is formed in at least one field region of: the plurality of first field regions or the plurality of second field regions, of the substrate.

Another aspect of the present disclosure provides a method for forming a memory device. A first wafer includes a first substrate, an array of transistor structures configured in rows and columns and formed on the first substrate, isolation structures formed in the first substrate and between adjacent transistor structures, and a first dielectric layer formed on the array of transistor structures. A second wafer includes a second substrate and a second dielectric layer formed on the second substrate. The second dielectric layer of the second wafer is bonded with the first dielectric layer of the first wafer. The first substrate is thinned to provide a thinned first substrate. Backside deep trenches are formed through the thinned first substrate and the backside deep trenches are connected to the isolation structures of the first wafer. Backside deep trench isolation structures are formed on corresponding isolation structures by forming a dielectric material in the backside deep trenches.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

The present disclosure provides Local word line driver device, memory device, and fabrication method. A local word line driver device includes a substrate and an array of transistor structures formed on the substrate. The transistor structures are configured in rows and columns. The substrate includes a plurality of first field regions each between adjacent rows of the transistor structures, and a plurality of second field regions each between adjacent columns of the transistor structures. A deep trench isolation structure is formed in at least one field region of: the plurality of first field regions or the plurality of second field regions, of the substrate.

Figure 1:
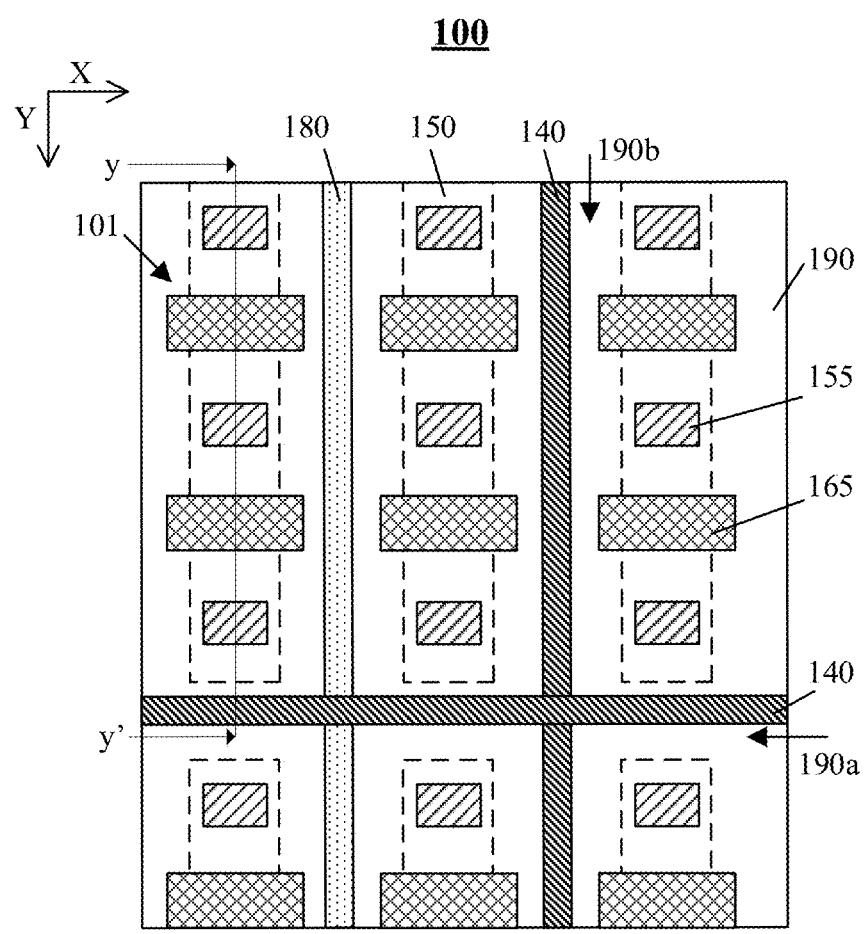
FIG. 1 illustrates a portion of an exemplary local word line driver device consistent with various disclosed embodiments in the present disclosure.
Figure 2:
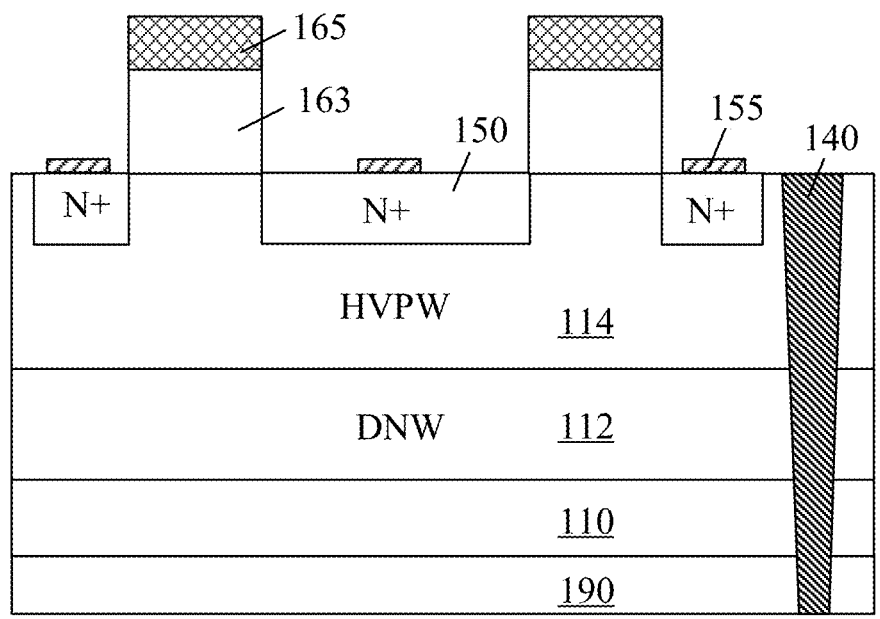
FIG. 2 illustrates an exemplary transistor structure along y-y' direction in FIG. 1 consistent with various disclosed embodiments in the present disclosure.

FIG. 1 illustrates a part of an exemplary local word line driver (LWLD) device 100 for a memory device according to various embodiments of the present disclosure. FIG. 2 illustrates a cross-section view of an exemplary transistor structure along y-y' direction of the LWLD device 100 of FIG. 1 according to various embodiments of the present disclosure.

As shown in FIGS. 1-2, the exemplary LWLD device 100 may include a substrate 110, an array of transistor structures 101 formed on the substrate 110, and at least one deep trench isolation (DTI) structure 140 formed in the substrate 110. Optionally and additionally, one or more p-well taps 180 may be formed in the substrate 110.

In one embodiment, the transistor structures 101 in the array may be N-type transistors. In various embodiments, the transistor structures 101 may also be referred to as high voltage NMOS (HVN) structures. A transistor structure 101 may include a single transistor or back-to-back transistors. For example, a transistor structure 101 may include transistors with a shared/common drain region. The transistor structures in the array may be used as pass transistors, for connecting global word lines to local word lines in a high-density memory device. One of the source/drain electrodes of the transistor may be connected to a word line of the memory device. The word line may be coupled to a plurality of memory cells.

As shown in FIG. 2, the transistor structure may be formed in an exemplary triple well structure to support high voltages applied to local word lines. For example, the transistor structures 101, or pass transistors, may be formed in a substrate 110, such as a p-type substrate. The substrate 110 may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. In one embodiment, the substrate 110 is a silicon substrate.

An n-well 112, such as a deep n-well (DNW), may be formed in the p-type substrate. The n-well 112 may be doped with n-type ions, including P ions, As ions, Sb ions, etc. A p-well 114, such as a high voltage p-well (HVPW), may be formed in the n-well 112. The p-well 114 may be doped with p-type ions, including B ions, Ga ions, In ions, etc. The triple well structure provides isolation of the channel regions of the pass transistors from the grounded substrate.

A gate structure may include a gate electrode 165 formed on a gate dielectric layer 163. The gate structure may be formed on the substrate 110. Source/drain regions 150 may be formed in the substrate 110 on each side of the gate structure. Source/drain regions 150 may be, for example, doped n-regions. Such doped n-regions may be high voltage n-type (HVN) regions. Source/drain electrodes 155 may be formed on the source/drain regions 150. A conductive plug or other interlayer connections may be electrically connected to the source/drain electrode.

Referring to FIG. 1, the transistor structures 101 in the array may be arranged along an X-direction (e.g., a row direction) and a Y-direction (e.g., a column direction). For example, the array may include rows and columns of transistor structures 101. In one embodiment, the Y-direction may be a direction in parallel with a channel length between the source and drain regions of the transistors. The X-direction may be substantially perpendicular to the Y-direction.

The LWLD device 100 may further include field regions 190, having a dimension or providing a spacing, between any adjacent transistor structures 101. The field regions 190 may include first field region(s) 190a between adjacent transistor structures 101 in Y-directions (e.g., between adjacent rows of transistor structures 101) and second field region(s) 190b between adjacent transistor structures 101 in X-direction (e.g., between adjacent columns of transistor structures 101).

The at least one DTI structure 140 may be formed in the first and/or second field regions 190a-b of the substrate 110, between any adjacent rows and/or columns of transistor structures 101. For example, as shown FIG. 1, the LWLD device 100 may include one DTI structure 140 formed in a first field region 190a between adjacent rows of transistor structures and one DTI structure 140 formed in a second field region 190b between adjacent columns of transistor structures.

The DTI structure 140 may be made of a dielectric material including, silicon oxide, silicon nitride, silicon oxynitride, or any other suitable material. In one embodiment, the DTI structure 140 is silicon oxide. The DTI structure may have one dimension of less than about 0.5 micron.

Depending on the thickness of the substrate 110, a thickness the DTI structures 140 may be controlled. For example, the DTI structure 140 may be formed passing through an entire thickness of the substrate 110.

In some embodiments, the LWLD device 100 may further include a dielectric layer 190 on the substrate 110 at a side opposite to the array of transistor structures 101. In this case, the DTI structure 140 may be formed passing through an entire thickness of each of the substrate 110 and the dielectric layer 190. As such, the thickness the DTI structures 140 may be further controlled, depending on the thickness of each of the substrate 110 and the dielectric layer 190.

Referring back to FIG. 1, in addition to the at least one DTI structure 140, a well tap, such as a p-well tap 180 or p+ tap, may be formed in one or more of remaining first and second field regions 190a-b between adjacent rows or columns of transistor structures 101. For example, as shown FIG. 1, the p-well tap 180 may be formed in one of the second field regions 190b between corresponding adjacent columns of transistor structures 101. In some embodiments, the p-well tap may also be referred to as a p-type high voltage (PHV) bar.

In one embodiment, one p-well tap 180 and one DTI structure 140 may be formed on second field regions 190b that are located on both sides of one of the columns of transistor structures 101. In a specific example, a p-well tap 180 and a DTI structure 140 may be alternatingly formed on the second field regions 190b between columns of transistor structures 101. In some embodiments, a column of transistor structures 101 is sandwiched by a p-well tap 180 and a DTI structure 140.

In conventional memory devices, p-type field implant may be formed in the field regions between adjacent columns of n-type transistor structures to suppress punch through. However, the field implant requires an implant of same type ions as in the substrate, which may worsen the drain-source breakdown voltage (BVDss) of the transistor structures. In addition, during fabrication, the field implant may be formed requiring an additional mask and process, which increases cost and complexity of the fabrication process.

In contrast, field implants are eliminated from the disclosed LWLD devices. Instead, forming DTI structures in the LWLD device may effectively solve the punch through problems and may also reduce cost and complexity of the fabrication process. Further, compared with conventionally used field implants and p+ well region, DTI structures provide more controllable dimensions. For example, the formation of DTI structures may provide a reduced surface area for the field regions (or a reduced spacing) between adjacent rows and columns of transistor structures. Even further, the DTI structures may be formed based on the isolation structures (e.g., aligned with and formed on the isolations structures) between transistor structures without occupying extra field regions of the substrate. Indeed, due to formation of the DTI structures, the conventionally formed p+ well that is located adjacent to the isolation structures may thus be eliminated to save more space for the disclosed device. This allows significant shrinkage of the resultant LWLD devices and significantly improve storage density of resultant memory device.

Figure 3:
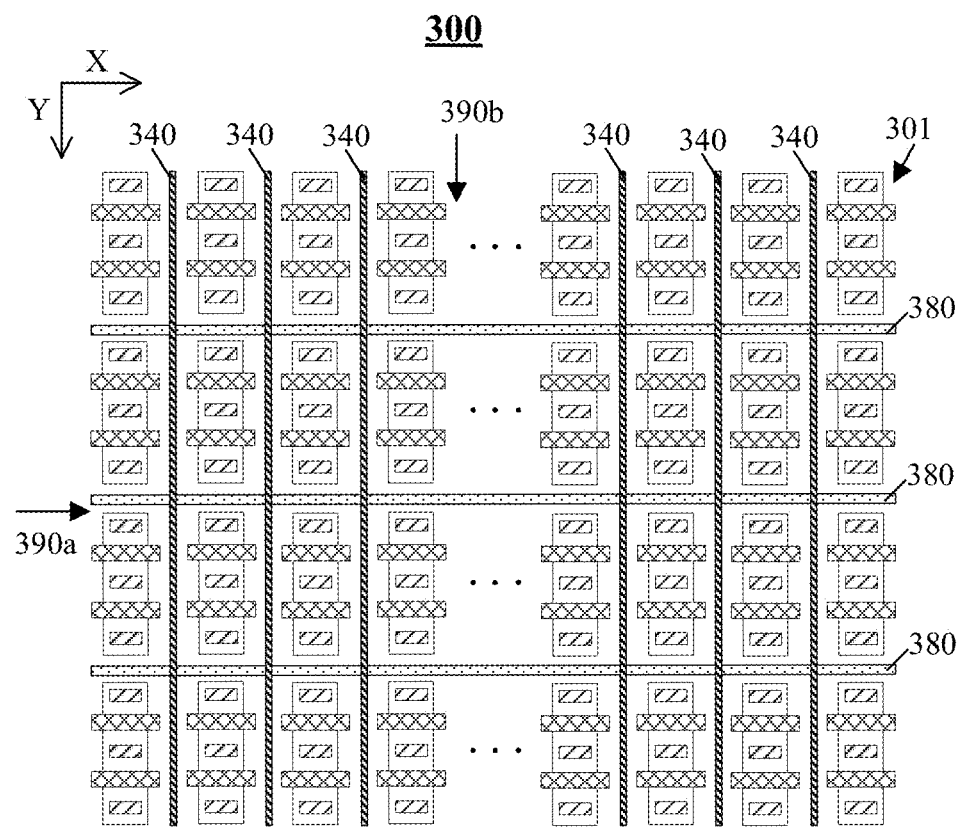
FIG. 3 illustrates a portion of another exemplary local word line driver device consistent with various disclosed embodiments in the present disclosure.
Figure 4:
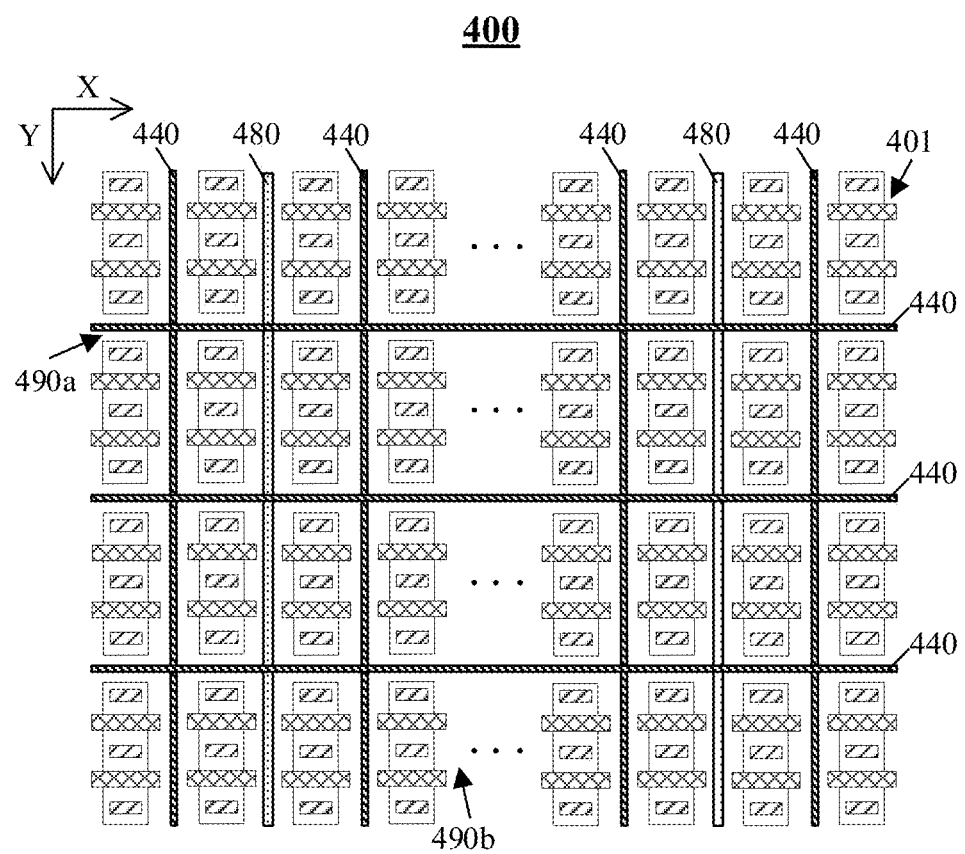
FIG. 4 illustrates a portion of another exemplary local word line driver device consistent with various disclosed embodiments in the present disclosure.

According to various embodiments, the LWLD device may include a variety of configurations including at least one DTI structure. For example, DTI structures may be formed in all of the first and second field regions between adjacent rows and columns of transistor structures. In another example, any combination(s) of the DTI structure(s) and p-well tap(s) may be included in the disclosed LWLD device. FIGS. 3-4 illustrate other exemplary local word line driver devices consistent with various disclosed embodiments in the present disclosure.

Referring to FIG. 3, in an exemplary LWLD device 300, DTI structures 340 may be formed on all second field regions 390b between all adjacent columns of transistor structures 301, and P-well taps 380 may be formed on all first field regions 390a between all adjacent rows of transistor structures 301. In this case, dimensions of field regions or spacings between adjacent columns may be significantly reduced. Such configuration may be used, for example, in a three-finger block scheme for a memory device.

Of course, alternatively in another exemplary LWLD device, DTI structures may be formed on all first field regions and p-well taps may be formed on all second field regions. In this case, dimensions of field regions or spacings between adjacent rows may be significantly reduced.

Referring to FIG. 4, in an exemplary LWLD device 400, DTI structures 440 may include a first plurality of DTI structures formed in all first field regions 490a between all adjacent rows of transistor structures 401 and may include a second plurality of DTI structures formed in some of the second field regions 490b between corresponding adjacent columns of transistor structures 401. In addition, one or more p-well taps 480 may be formed in some of the second field regions 490b between corresponding adjacent columns of transistor structures 401. For example, as shown in FIG. 4, DTI structures 440 and P-well taps 480 may be formed alternatingly in the second field regions 490b. Such configuration may be used, for example, in a two-finger block scheme for a memory device.

Various embodiments may also provide a memory device including the disclosed LWLD device. For example, the memory device may include a memory array, including blocks of memory cells. A block of memory cells can include a plurality of NAND strings. The plurality of NAND strings may share a set of word lines. A row decoder may be coupled to a plurality of word lines arranged along rows in the memory array. The row decoder may include a LWLD device including a set of local word line (LWL) drivers that drives respective word lines in the set of word lines in a block of memory cells.

Figure 5:
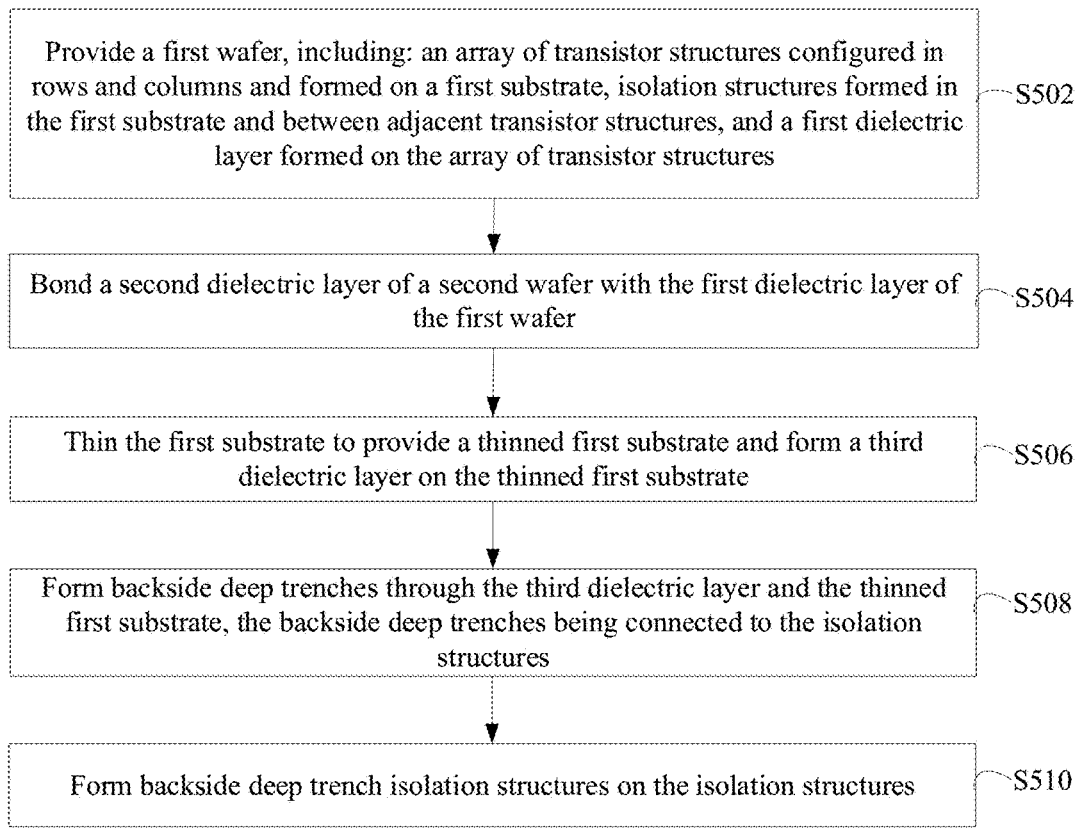
FIG. 5 illustrates a flowchart of an exemplary method for forming an exemplary memory device including a local word line driver device consistent with various disclosed embodiments in the present disclosure.

Various embodiments further provide methods for forming word line driver (LWLD) devices and a memory device including the LWLD device. FIG. 5 illustrates a flowchart of an exemplary method for forming an exemplary memory device consistent with various disclosed embodiments in the present disclosure. FIGS. 6-10 illustrate schematic views of semiconductor structures at certain stages of the exemplary formation process.

Figure 6:
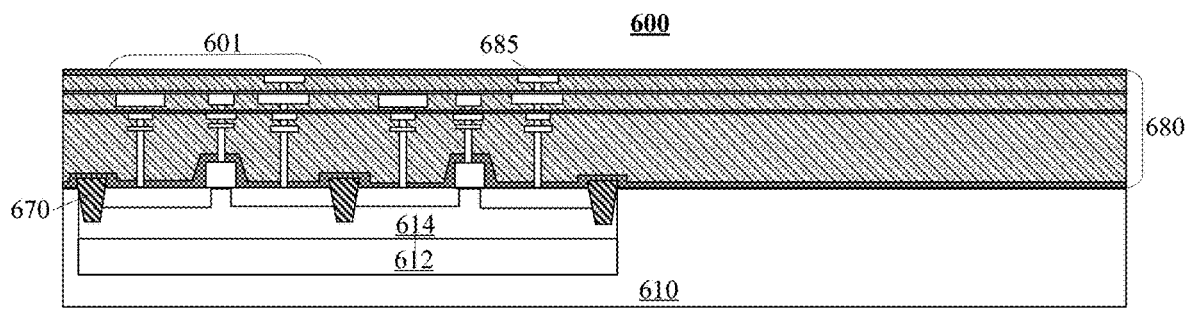
FIGS. 6-10 illustrate schematic views of semiconductor structures at certain stages during a fabrication process of an exemplary memory device consistent with various disclosed embodiments in the present disclosure.

Referring to FIG. 5, at the beginning of the fabrication process, a first wafer is provided (S502). The first wafer may include an array of transistor structures configured in rows and columns and formed on a first substrate, isolation structures formed in the first substrate and between adjacent transistor structures, and a first dielectric layer formed on the array of transistor structures. FIG. 6 illustrates a schematic cross-section view of a corresponding semiconductor structure.

In FIG. 6, a first wafer 600 is provided. The first wafer 600 may include a first substrate 610 and an array of transistor structures 601 formed on the first substrate 610.

The transistor structure 601 may be formed in a triple well structure to support high voltages and negative voltages applied to local word lines. For example, the first substrate 610 may be a p-type substrate; an n-well 612, such as a deep n-well (DNW), may be formed in the first substrate 610; and a p-well 614, such as a high voltage p-well (HVPW), may be formed in the n-well 612. Any suitable substrate may be used for the substrate 610. The substrate 610 may be same as or different than the substrate 110 in FIGS. 1-2.

In the transistor structure 601, a gate structure may be formed on the first substrate 610. Source/drain regions may be formed in the p-well 614 on each side of the gate structure of the transistor structure. The transistor structure 601 may include any transistor, used as a pass transistor. The pass transistor may be used for connecting global word lines to local word lines in a high-density memory device.

Any suitable transistor structure may be formed in the first wafer 601. For example, although not illustrated in FIG. 6, the transistor structure 601 may also include a transistor structure 101, 200, 301, and 401 as illustrated in FIGS. 1-4, along with their corresponding configurations. For example, the transistor structures 601 in the array may be arranged along an X-direction (e.g., a row direction) and a Y-direction (e.g., a column direction). The array may include rows and columns of transistor structures 601 formed on the first substrate 610.

Isolation structures 670 may be formed in the first substrate 610 and between transistor structures 601. The isolation structures 670 may include a shallow trench isolation structure formed by a dielectric material.

A first dielectric layer 680 may be formed on the first substrate 610. The first dielectric layer 680 may include interlayer dielectric layers. Conductive interconnections 685 may be formed in the first dielectric layer 680. The conductive interconnections 685 may be electrically connected to the gate structure and source/drain regions of each transistor structure 601.

In various embodiments, the first wafer 600 may optionally include p-well tap or p-well taps, including those shown FIGS. 1 and 3-4 formed in suitable field regions. In the case that p-well tap(s) are included in the formed memory device, the p-well tap(s) may be pre-fabricated before the first wafer is bonded with a second wafer (e.g., a memory array wafer), and/or before the deep trench isolation structures are formed.

Figure 7:
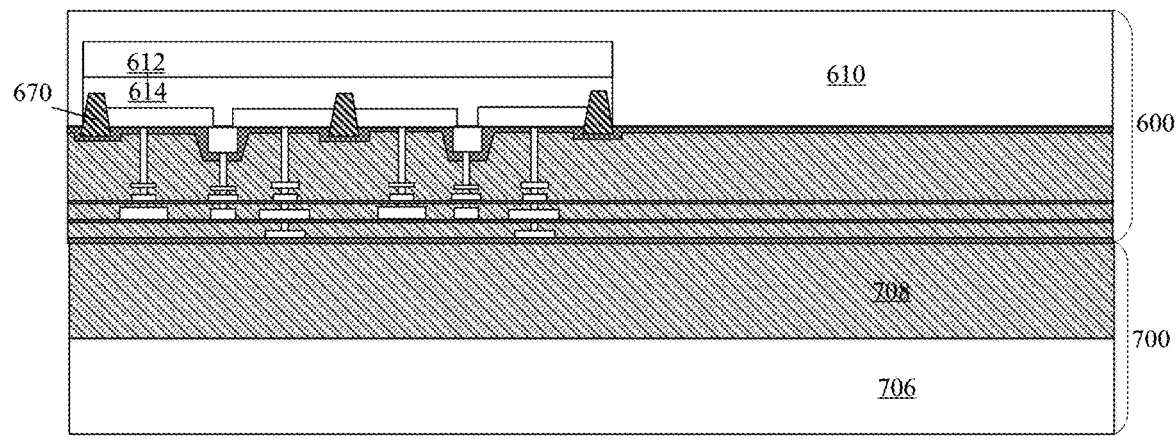

Referring back to FIG. 5, a second wafer may be provided and bonded with the first wafer (S504). The second wafer may include a second substrate and a second dielectric layer on the second substrate. The second dielectric layer of the second wafer may be bonded with the first dielectric layer of the first wafer. FIG. 7 illustrates a schematic cross-section view of a corresponding semiconductor structure.

In FIG. 7, a second wafer 700 may include a second substrate 706 and a second dielectric layer 708 on the second substrate 706. The second dielectric layer 708 of the second wafer 700 may be bonded with the first dielectric layer 680 of the first wafer 600, such that the first and second wafers are bonded together.

For example, when bonding the second wafer 700 with the first wafer 600, the second dielectric layer 708 may be attached to the first dielectric layer 680. In various embodiments, the second wafer 700 may be memory array wafer including memory arrays of a memory device. Any suitable materials and processes for a dielectric layer and a substrate of a memory array wafer may be used for the disclosed second substrate 706 and second dielectric layer 708 and encompassed by the present disclosure.

Figure 8:
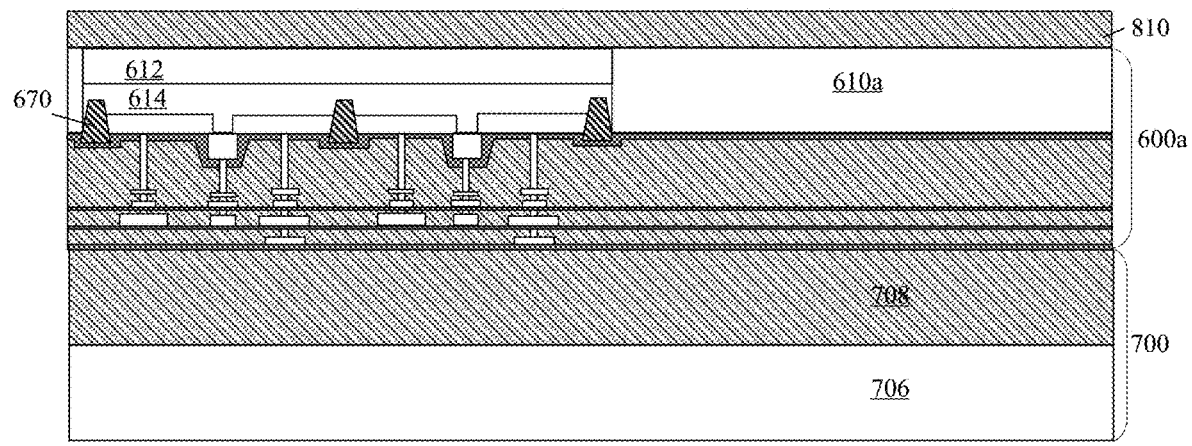

Referring back to FIG. 5, the first substrate of the first wafer may be thinned to provide a thinned first substrate and a third dielectric layer may be formed on the thinned first substrate (S506). FIG. 8 illustrates a schematic cross-section view of a corresponding semiconductor structure.

In FIG. 8, a thinning process may be performed from a backside of the first wafer 600. The thinning process may include one or more of a chemical mechanical polishing process (CMP), a wet etching process, or a dry etching process. The first substrate 610 may be thinned to form a thinned first substrate 610a. In one embodiment, after thinning, the n-well 612 may (or may not) be exposed.

Optionally, a third dielectric layer 810 may be deposited on the thinned first substrate 610a. For example, the third dielectric layer 810 may include any suitable dielectric material and may be deposited by a process of chemical vapor deposition (CVD), physical vapor deposition (PVD), or atomic layer deposition (ALD).

Figure 9:
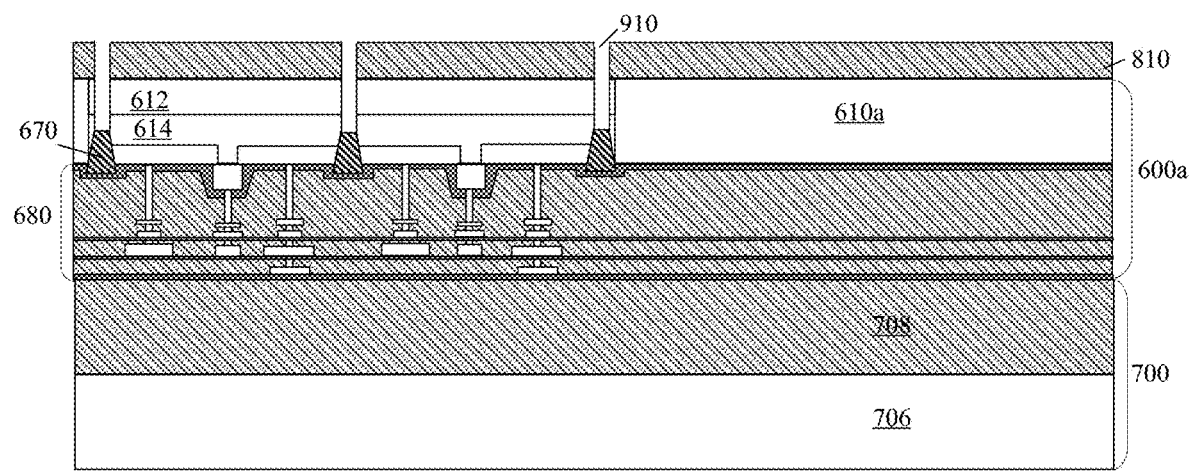

Referring back to FIG. 5, backside deep trenches may be formed through the optional third dielectric layer and/or the thinned first substrate, the backside deep trenches being connected to the isolation structures (S508). FIG. 9 illustrates a schematic cross-section view of a corresponding semiconductor structure.

In FIG. 9, backside deep trenches 910, e.g., through-holes, may be formed through the third dielectric layer 810 and/or thinned first substrate 610a and between transistor structures 601. The backside deep trench 910 may be formed connecting to a corresponding isolation structure 670.

For forming the backside deep trenches 910, a patterned layer (not shown) may be formed on the third dielectric layer 810. The patterned layer may expose portions of the third dielectric layer 810 on the thinned first substrate 610a. The exposed portions of the third dielectric layer 810 and the underlying thinned first substrate 610a may be removed by an etching process using the patterned layer as an etch mask. After the etching process, the patterned layer may be removed. Depending on the materials used for the third dielectric layer 810 and the thinned first substrate 610a, any suitable etching process may be used. For example, wet and/or dry etching processes may be used to remove portions of the third dielectric layer 810 and/or the thinned first substrate 610a to form the backside deep trenches 910.

The backside deep trenches 910 may be aligned with the isolation structures 670, such that the backside deep trench 910 is connected to a corresponding isolation structure 670 to partially or wholly expose a surface of the corresponding isolation structure 670. For example, an orthogonal projection of each backside deep trench 910 may partially or wholly cover an orthogonal projection of a corresponding isolation structure 670 on the interface between the thinned first substrate 610a and the second dielectric layer 680.

Figure 10:
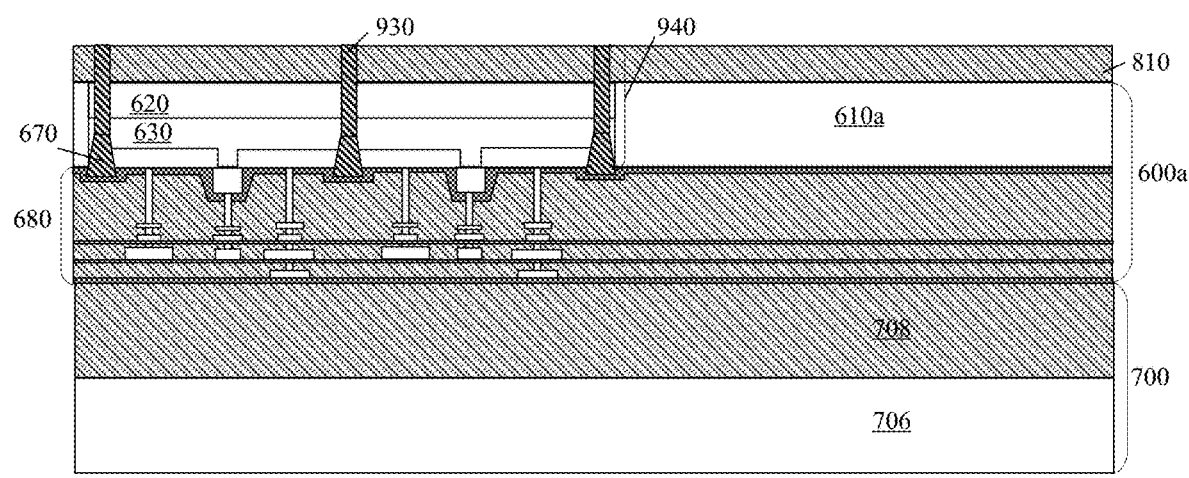

Referring back to FIG. 5, backside deep trench isolation (BDTI) structures may be formed on the isolation structures to fill up the backside deep trenches (S510). FIG. 10 illustrates a schematic cross-section view of a corresponding semiconductor structure.

In FIG. 10, a backside DTI (BDTI) structure 930 may be formed in each backside deep trench 910 through the thinned first substrate 610a and/or the third dielectric layer 810. The BDTI structure 930 is formed between transistor structures 601. The BDTI structure 930 may be formed at least partially connecting to the isolation structure 670. The BDTI structure 930 may "extend" the isolation structure 670 through the first substrate and/or further through the third dielectric layer on the first substrate.

An orthogonal projection of each BDTI structure 930 may partially or wholly cover an orthogonal projection of a corresponding isolation structure 670 on the interface between the thinned first substrate 610a and the second dielectric layer 680.

The BDTI structures 930 may be made of a dielectric material including, silicon oxide, silicon nitride, silicon oxynitride, or any other suitable material. The BDTI structures 930 may be formed by a deposition process, such as chemical vapor deposition (CVD), physical vapor deposition (PVD), and atomic layer deposition (ALD). In one embodiment, the BDTI structures 930 may be formed by an oxidation process. The BDTI structures 930 are made of silicon oxide. The deep trench isolation (BDTI) structure may have one dimension of less than about 0.5 micron.

For example, for forming the BDTI structures 930, a BDTI material film may be deposited in the backside deep trenches 910 and on surface of the third dielectric layer 810. A planarization process may then be performed to remove a portion of the BDTI material film above the third dielectric layer 810 to expose a surface of the third dielectric layer 810.

Depending on the thinning process of the first substrate 610 and a thickness of the third dielectric layer 810, a thickness the BDTI structures 930 may be controlled.

As such, the combination of the BDTI structures 930 and isolation structure 670 may form the disclosed deep trench isolation (DTI) structure 940. The BDTI structures 930 and the isolation structure 670 may be made of a same or different material in the DTI structure 940.

Such DTI structure, including the BDTI and the isolation structure, may be formed in the field regions along rows and/or columns of the transistor structures to provide LWLD devices, as similarly described in FIGS. 1 and 3-4. By forming DTI structures based on the isolation structures, field regions of the first substrate 610 may be saved or reduced. Further, the conventionally formed p+ well that is located adjacent to an isolation structure may be eliminated to save more space and to provide field regions with reduced surface area for the resultant device.

Additionally, DTI structures may effectively solve the punch through problems of the resultant devices and may also reduce cost and complexity of fabrication process, compared with conventional p-type field implants formed in the field regions between adjacent columns of n-type transistor structures, which are eliminated from the disclosed LWLD devices. Further, compared with conventionally used combination of field implants and p+ well region, DTI structures provide more controllable dimensions, which allow significant shrinkage of the resultant devices and significantly improve storage density of resultant memory device.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A local word line driver device, comprising:
a substrate;
an array of transistor structures formed on the substrate, the transistor structures being configured in rows and columns, wherein the substrate includes:
a plurality of first field regions each between adjacent rows of the transistor structures, and
a plurality of second field regions each between adjacent columns of the transistor structures; and
a deep trench isolation structure, formed in at least one field region of: the plurality of first field regions or the plurality of second field regions, of the substrate.

2. The device according to claim 1, wherein:
the transistor structures in the array includes N-type transistors, and
a p-well tap is formed on one or more remaining field regions of: the plurality of first field regions or the plurality of second field regions, of the substrate.

3. The device according to claim 1, wherein:
the deep trench isolation structure has one dimension of less than about 0.5 micron.

4. The device according to claim 1, wherein:
the deep trench isolation structure is made of a material including silicon oxide, silicon nitride, or silicon oxynitride.

5. The device according to claim 1, wherein:
the deep trench isolation structure passes through an entire thickness of the substrate.

6. The device according to claim 1, further including:
a dielectric layer formed on the substrate at a side opposite to the array of the transistor structures.

7. The device according to claim 1, wherein:
the deep trench isolation structure is formed in each of the plurality of first field regions or the plurality of second field regions, of the substrate.

8. The device according to claim 2, wherein:
a column of transistor structures in the array is sandwiched by one deep trench isolation structure and one p-well tap.

9. The device according to claim 2, wherein:
the deep trench isolation structure is formed in each of the plurality of second field regions, and
the p-well tap is formed in each of the plurality of first field regions of the substrate.

10. The device according to claim 2, wherein:
the deep trench isolation structure is formed in each of the plurality of first field regions, and
the p-well tap and the deep trench isolation structure are alternatingly formed in the plurality of second field regions of the substrate.

11. A memory device, comprising:
a local word line driver device, including:
a substrate;
an array of transistor structures formed on the substrate, the transistor structures being configured in rows and columns, wherein the substrate includes:
a plurality of first field regions each between adjacent rows of the transistor structures, and
a plurality of second field regions each between adjacent columns of the transistor structures; and
a deep trench isolation structure, formed in at least one field region of: the plurality of first field regions or the plurality of second field regions, of the substrate.

12. A method for forming a memory device, comprising:
providing a first wafer, including:
a first substrate, an array of transistor structures configured in rows and columns and formed on the first substrate, isolation structures formed in the first substrate and between adjacent transistor structures, and a first dielectric layer formed on the array of transistor structures;
providing a second wafer, including a second substrate and a second dielectric layer formed on the second substrate;
bonding the second dielectric layer of the second wafer with the first dielectric layer of the first wafer;
thinning the first substrate to provide a thinned first substrate;
forming backside deep trenches through the thinned first substrate, wherein the backside deep trenches are connected to the isolation structures of the first wafer; and
forming backside deep trench isolation structures on corresponding isolation structures by forming a dielectric material in the backside deep trenches.

13. The method according to claim 12, wherein the first substrate includes:
a plurality of first field regions each between adjacent rows of transistor structures, and
a plurality of second field regions each between adjacent columns of transistor structures.

14. The method according to claim 13, wherein:
the transistor structures in the array includes N-type transistors, and
the method further includes:
prior to bonding the second dielectric layer of the second wafer with the first dielectric layer of the first wafer, forming a p-well tap in one or more field regions that are free of any backside deep trench isolation structure subsequently formed in the first wafer.

15. The method according to claim 12, further including:
forming a third dielectric layer on the thinned first substrate, and
wherein forming the backside deep trenches further includes:
forming the backside deep trenches through the third dielectric layer and the thinned first substrate.

16. The method according to claim 12, wherein:
the second wafer includes a memory array.

17. The method according to claim 12, wherein:
the backside deep trench isolation structures and the isolation structures are made of a different material.

18. The method according to claim 12, wherein:
the backside deep trench isolation structures are made of a material including silicon oxide or silicon oxynitride.

19. The method according to claim 12, wherein:
the backside deep trench isolation structures are formed by a deposition process including a chemical vapor deposition (CVD), a physical vapor deposition (PVD), and an atomic layer deposition (ALD).

20. The method according to claim 12, wherein:
the backside deep trench at least partially exposes a surface of a corresponding isolation structure.

* * * * *